(12) United States Patent
Yasotharan et al.

(10) Patent No.: US 7,421,029 B2
(45) Date of Patent: Sep. 2, 2008

(54) IMPULSE RESPONSE SHORTENING AND SYMBOL SYNCHRONIZATION IN OFDM COMMUNICATION SYSTEMS

(75) Inventors: Ambighairajah Yasotharan, Toronto (CA); Dmitri Korobkov, Frankfurt am Main (DE)

(73) Assignee: Unique Broadband Systems, Inc., Concord, Ontario (CA)

(*) Notice: Subject to any disclaimer, the term of this patent is extended or adjusted under 35 U.S.C. 154(b) by 773 days.

(21) Appl. No.: 10/326,481

(22) Filed: Dec. 20, 2002

(65) Prior Publication Data

US 2004/0120409 A1 Jun. 24, 2004

(51) Int. Cl.
*H04K 1/10* (2006.01)

(52) U.S. Cl. ............ 375/260; 375/350; 375/360; 375/232; 370/509; 370/511; 370/514

(58) Field of Classification Search ............ 375/260, 375/229, 232, 350, 360; 370/509, 511, 514
See application file for complete search history.

(56) References Cited

U.S. PATENT DOCUMENTS

| | | | |
|---|---|---|---|
| 4,418,350 A * | 11/1983 | Rosen | 342/359 |
| 4,674,103 A * | 6/1987 | Chevillat et al. | 375/231 |
| 5,732,113 A | 3/1998 | Schmidl et al. | |
| 6,628,724 B2 * | 9/2003 | Bannasch et al. | 375/259 |
| 6,834,079 B1 * | 12/2004 | Strait et al. | 375/232 |
| 6,930,989 B1 * | 8/2005 | Jones IV et al. | 370/335 |
| 7,027,464 B1 * | 4/2006 | Nakahara et al. | 370/503 |
| 2002/0110199 A1 * | 8/2002 | Happonen et al. | 375/295 |
| 2002/0126618 A1 * | 9/2002 | Kim | 370/208 |
| 2003/0043887 A1 * | 3/2003 | Hudson | 375/144 |
| 2006/0104195 A1 * | 5/2006 | Nakahara et al. | 370/203 |

OTHER PUBLICATIONS

Jacky S. Chow, John M. Cioffi, and John A.C. Bingham, "Equalizer Training Algorithms For Multicarrier Modulation Systems", IEEE, 1993, pp. 761-765.

Peter J.W. Melsa, Richard C. Younce, and Charles E. Rohrs, "Impulse Response Shortening For Discrete Multitone Transceivers", IEEE, Dec. 1996, pp. 1662-1672, vol. 44, No. 12.

Debajyotipal, Garud N. Iyengar, and J.M. Cioffi, "A New Method Of Channel Shortening With Applications To Discrete Multi Tone (DMT) Systems", IEEE, 1998, pp. 763-768.

\* cited by examiner

*Primary Examiner*—Mohammad Ghayour
*Assistant Examiner*—Leila Malek
(74) *Attorney, Agent, or Firm*—Hodgson Russ LLP

(57) ABSTRACT

A method for receiving at a receiver having a variable filter a transmitted signal that includes a periodic training signal. The method includes (a) receiving and sampling the transmitted signal at the receiver to produce a digital complex baseband signal; (b) filtering the digital complex baseband signal with the variable filter; (c) detecting the periodic training signal in the filtered digital complex baseband signal; (d) determining a desired channel impulse response based on the detected periodic training signal; (e) calculating filter coefficients required by the variable filter to achieve the desired channel impulse response; and (f) adjusting the variable filter according to the calculated filter coefficients. A receiver for implementing the method is also provided.

15 Claims, 11 Drawing Sheets

IMPULSE RESPONSE SHORTENING AND SYMBOL SYNCHRONIZATION IN OFDM COMMUNICATION SYSTEMS

BACKGROUND OF THE INVENTION

The present invention relates to a method and apparatus for receiving communication signals. More particularly, the invention concerns channel estimation, impulse response shortening and symbol synchronization in an OFDM communications system.

In Orthogonal Frequency Division Multiplexing (OFDM), information is transmitted using a plurality of sub-carriers whose frequencies are uniformly spaced in a given bandwidth. In an OFDM communications system, generally speaking, the sequence of information source bits is mapped onto a set of N parallel sequences of complex numbers chosen from finite alphabets. The alphabets from which the complex numbers are chosen may be QAM alphabets or PSK alphabets; different alphabets may be used on different sequences. The mapping of the information source bits onto the N parallel sequences of complex numbers will generally involve some form of forward error correction coding and permutation, in order to make the system robust against channel impairments such as noise and frequency-selectivity.

Each sequence of complex numbers is then transmitted on a separate sub-carrier using Quadrature-Amplitude-Modulation of a rectangular pulse of length T seconds. If the pulses transmitted on the separate sub-carriers are mutually aligned, the sub-carriers are uniformly spaced 1/T Hz apart and the channel response is constant over the entire frequency band, then each received sub-carrier can be individually demodulated without any inter-carrier interference or inter-symbol interference. If the channel response is not constant, then choosing T to be much larger than the delay spread of the channel will reduce the inter-carrier interference and inter-symbol interference. However, for a given total bandwidth, a large value of T will result in a large value of N, and thus in a system with large complexity.

For channels whose delay-spread is limited, the preferred approach is to increase the length of the rectangular pulse with a cyclic guard interval of $T_g$ seconds, which is greater than the delay spread. This allows the receiver to identify some T-second-long portion of each received pulse that is free of inter-carrier interference and inter-symbol interference, correct for amplitude and phase changes caused by the channel, and demodulate it.

The use of a cyclically extended guard portion allows low-complexity demodulation of the received signal, without having to worry about inter-sub-carrier interference or inter-symbol interference. To realize these benefits, the length of the cyclically extended guard portion must be greater than the length of the effective overall impulse response of the cascade of the transmitter filters, propagation channel, and the receiver filters. The price being paid is the reduction in throughput by a factor $T/(T+T_g)$ and a reduction in power efficiency by approximately the same factor.

In some scenarios, the effective overall impulse response can be very long due the delay-spread of propagation channel being very large or the impulse response of the transmit/receive filter being very long. In these scenarios, choosing $T_g$ to be greater than the length of the overall impulse response will result in the throughput and efficiency of the system being extremely poor. Some proposals suggest the use of a sub-optimal receiver filter so as to achieve a short overall impulse response of a desired length—the receiver filter is sub-optimal in the sense that the noise at the output may be correlated, and the degree of correlation is a measure of the sub-optimality of the receiver filter.

Several methods have been previously proposed to separately solve the problems of channel estimation, impulse response shortening, and symbol synchronization in OFDM communication systems. See for example: J. S. Chow, J. M. Cioffi, and J. A. Bingham, "Equalizer Training Algorithms for Multicarrier Modulation Systems", Proceedings of 1993 International Conference on Communications, Geneva, Switzerland, May 1993, pp 761-765; D. Pal, J. M. Cioffi, and G. Iyengar, "A new method of channel shortening with applications to DMT systems", International Conference on Communications, pp. 763-768, June 1998; and P. J. W. Melsa, R. C. Younce, and C. E. Rohrs, "Impulse response shortening for discrete multitone receivers", IEEE Trans. Commun., pp. 1662-1672, December 1996.

Some of the disadvantages of previous methods are that longer training signals are needed because the training signal must have portions dedicated to each of these tasks. Accordingly, an OFDM system in which all three problems could be jointly solved using the same training signal is desirable as it that would to increase system throughput.

SUMMARY OF THE INVENTION

In accordance with one aspect, the present invention provides a method and apparatus for estimating the overall channel impulse response in an OFDM transmission system and also modifying a receiver filter so as to shorten the overall channel transfer function and thereby facilitate the use of a shorter guard period. Preferably, a single training signal is used for channel estimation, impulse response shortening, and symbol synchronization.

According to one aspect of the invention, there is provided a method for receiving at a receiver having a variable filter a transmitted signal that includes a periodic training signal. The method includes steps of (a) receiving and sampling the transmitted signal at the receiver to produce a digital complex baseband signal; (b) filtering the digital complex baseband signal with the variable filter; (c) detecting the periodic training signal in the filtered digital complex baseband signal; (d) determining a desired channel impulse response based on the detected periodic training signal; (e) calculating filter coefficients required by the variable filter to achieve the desired channel impulse response; and (f) adjusting the variable filter according to the calculated filter coefficients. Preferably, the transmitted signal includes a data signal comprising OFDM symbols having cyclic guard intervals and the periodic training signal comprises a succession of substantially identical training pulses.

According to another aspect of the invention, there is provided a receiver for a transmitted signal that includes a periodic training signal. The receiver includes a converter for receiving a transmitted signal and producing a digital complex baseband signal representative thereof, a variable baseband receiver filter for receiving and filtering the digital complex baseband signal in dependence on filter coefficients, and a training signal processor. The training signal processor is for detecting a periodic training signal portion within the filtered digital complex baseband signal, estimating an initial channel impulse response based on the detected periodic training signal, calculating a shortened target channel impulse response in dependence on the initial channel impulse response and a predetermined target channel impulse response length, determining new filter coefficients required to implement the target channel impulse response, and providing the new filter coefficients to the variable baseband receiver filter for use in filtering a data portion of the digital complex baseband signal following the periodic training signal portion. Preferably, the data portion of the transmitted signal includes OFDM symbols each having a cyclic guard interval, the predetermined target channel impulse length being equal to or less than the cyclic guard interval, and the receiver includes an OFDM signal processor for decoding the OFDM symbols to produce a digital receiver output signal.

According to still a further aspect of the present invention, there is provided a transmitter that includes an OFDM generator for generating OFDM symbols based on an input data stream, a training signal generator for generating training signals each including a succession of at least three substantially identical linearly frequency modulated pulses, and multiplexing means for receiving the OFDM symbols and the training signals and generating an output signal comprising a plurality of frames, each frame including a training signal followed by a plurality of OFDM symbols.

BRIEF DESCRIPTION OF THE DRAWINGS

Preferred embodiments of the method and apparatus of the present invention will be described with reference to the following drawings.

DETAILED DESCRIPTION OF THE PREFERRED EMBODIMENTS

In a preferred embodiment, the present invention provides a method and apparatus for estimating the overall channel transfer function in an OFDM transmission system and modifying a receiver filter so as to shorten the overall channel impulse response and thereby facilitate the use of a shorter guard period.

Figure 1:
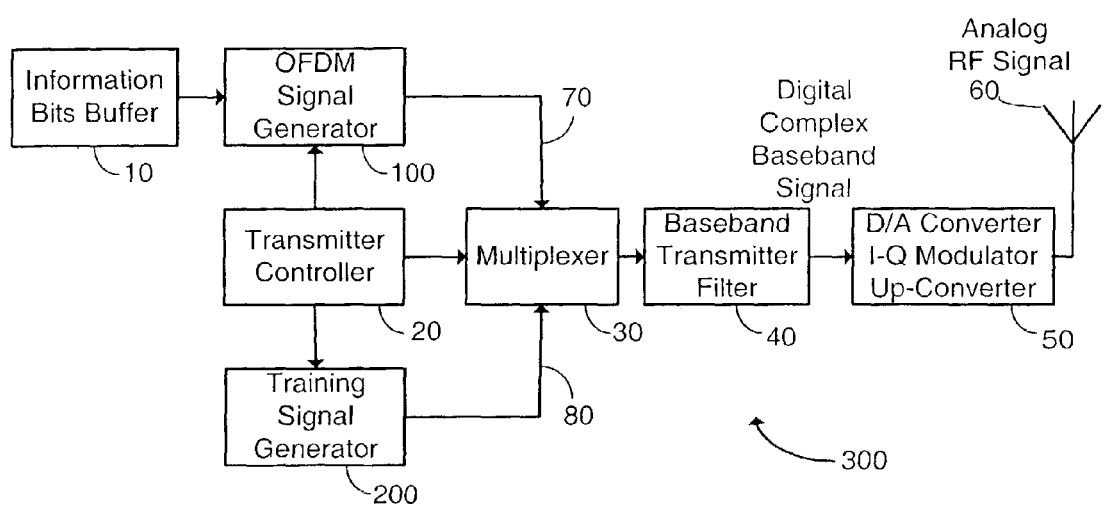
FIG. 1 is a conceptual block diagram of an OFDM transmitter according to embodiments of the present invention.

An OFDM transmitter 300 according to a preferred embodiment of the present invention is shown in FIG. 1. The OFDM transmitter 300 includes an information bits buffer 10, an OFDM signal generator 100, a baseband transmitter filter 40, and a front-end transmission module 50. In addition, the transmitter 300 also includes a training signal generator 200, for generating a training signal 202, a multiplexer 30 for selectively combining the output of the OFDM signal generator 100 and the output of the training signal generator, and a transmitter controller 20 for controlling the operation and timing of the OFDM signal generator 100, the multiplexer 30 and the training signal generator 200.

Figure 3:
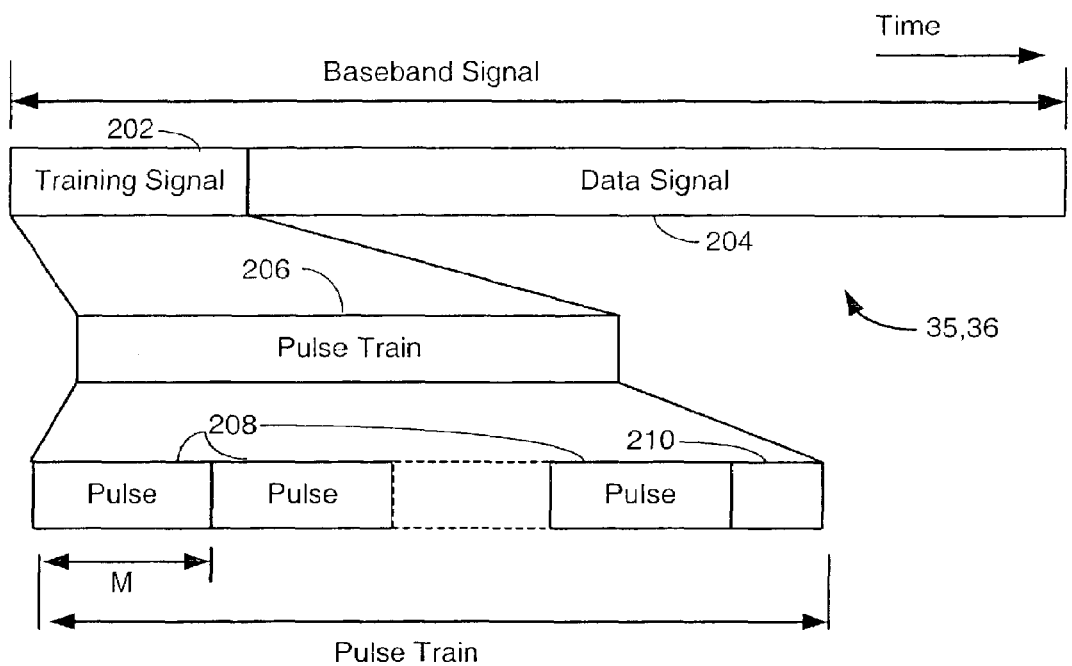
FIG. 3 illustrates the format of a training signal and its location within a transmitted signal according to embodiments of the present invention.
Figure 4:
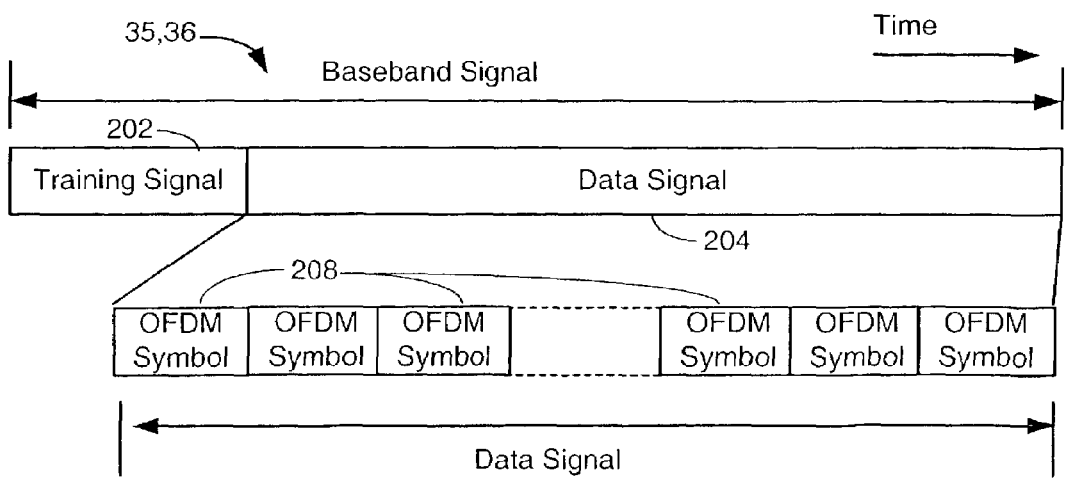
FIG. 4 illustrates the format of a data signal its location within the transmitted signal according to embodiments of the present invention.

The transmitter controller 20 controls the generation of a digital complex baseband signal 35 having, with reference to FIGS. 3 and 4, a training signal portion 202 followed by an OFDM data signal portion 204. The training signal portion 202 is generated by the training signal generator 200 and passed to the multiplexer 30 at a multiplexer input 80. The OFDM data signal portion 204 is generated by the OFDM signal generator 100 and passed to the multiplexer 30 at a further multiplexer input 70.

Under the control of the transmitter controller 20, the multiplexer 30 connects either its training signal input 80 or its OFDM signal input 70 to its output. The training signal portion 202 and the OFDM data signal portion 204 are sent to the multiplexer 30 one after the other, at the proper times, under the control of the transmitter controller 20, to generate an unfiltered version of the digital complex baseband signal 35, which is then passed through the baseband transmitter filter 40 where it is digitally filtered and the resulting digitally filtered digital complex baseband signal is provided to transmission module 50 that performs, in a conventional manner, digital-to-analog conversion, I-Q modulation, and up-conversion to output an analog RF signal for transmission from antenna 60.

Figure 2:
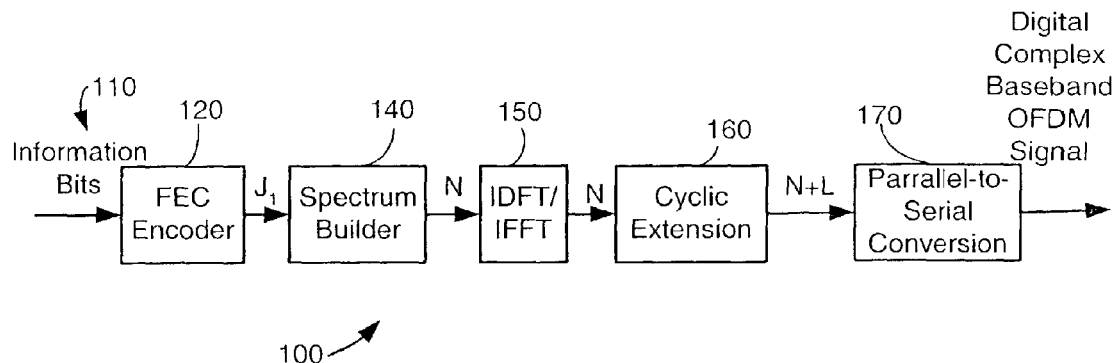
FIG. 2 is a conceptual block diagram of an example of a conventional OFDM signal generator of the OFDM transmitter of FIG. 1.

FIG. 2 shows a block diagram of the OFDM signal generator 100, which can be implemented using conventional OFDM signal generator technology, that generates the composite digital complex baseband OFDM signal 204. In the OFDM signal generator 100, an "Information Bits" sequence 110 is fed into a forward error correction (FEC) encoder 120 which maps it onto a sequence of complex-valued size-J1 vectors. A spectrum builder 140 then inserts, into each of the size-J1 vectors, some zeros to increase the size of the vectors to N. In some embodiments, pilot tones may be inserted by the spectrum builder 140. The sequence of size-N vectors thus formed is fed into an Inverse Discrete Fourier Transformer (IDFT) 150 that sequentially transforms each size-N vector to produce another size-N vector. The IDFT 150 is commonly implemented via an Inverse Fast Fourier Transform (IFFT) algorithm and hence, for reasons of computational efficiency, N is chosen to be a power of 2 or a product of powers of small primes numbers such as 2 and 3. Each size-N vector produced by the IDFT 150 is fed into a cyclic extension unit 160, which cyclically extends it to produce a size—(N+L) vector. While the cyclic extension can be done in many ways, in one common method a block of the last L elements output by IDFT 150 are copied and added as a prefix. The sequence of size—(N+L) vectors produced by the cyclic extension unit 160 is fed into a parallel-to-serial converter 170 that concatenates the vectors to produce the output digital complex bseband OFDM signal 175.

As indicated in FIG. 3, the training signal 202 is preferably located at the front of the baseband signal 35, and is a periodic pulse train 206 that is a concatenation of several copies of a basic "pulse" 208. Generally, the length of the periodic pulse train 206 will be the length of the basic pulse 208 times the number of pulses in the training signal 202. However, in some embodiments, it may be advantageous to choose the length of the "periodic pulse train" as an integer multiple of the length of an OFDM symbol. In such a case, there may be a need to periodically extend the last "pulse" of the "periodic pulse train" to achieve the desired length, or put a blank portion 210 at the end of the pulse train 206. The blank portion can be regarded as gap between the "periodic pulse train" and the "data signal".

Preferably, the basic pulse 208 has a duration of M discrete time units (a sample being taken in each discrete time unit, such that M is the number of samples), where M is chosen to be greater than the maximum expected duration of an initial overall channel impulse response of the subject transmission system. Choosing a larger M decreases the throughput and power efficiency of the system; this decrease is monotonic. However, a larger M may have to be chosen to reduce the computational complexity as explained below.

Conveniently, M can be selected to be a power of 2 or a product of powers of small integers like 2 and 3, for the efficient use of the FFT/IFFT algorithm.

M should be an integer multiple or an integer submultiple of N (as noted above N is the number of sub-carriers used for the OFDM symbols) for the following reasons. As will be explained in greater detail below, the OFDM receiver of the present invention includes a periodic pulse train processor that calculates an M-point DFT for a new overall channel impulse response. However, the OFDM receiver also determines an N-point DFT of the new overall impulse response. If the maximum expected length of an initial overall impulse response is greater than N, then it is advantageous to choose M to be an integer multiple of N, so that the N-point DFT can be obtained simply by decimating the M-point DFT. If the maximum expected length of the initial overall impulse response is less than N, then M=N can be chosen If the maximum expected length of the initial overall impulse response is less than N/2, then M can be selected to be an integer submultiple of N, so that the N-point DFT can be obtained by an FFT-based interpolation of the M-point DFT, that is, take the M-point FFT, fill in (N-M) zeros in the middle, and then take an N-point IFFT.

In the preferred embodiment of the present invention, the number of pulses in the periodic pulse train 206 is at least three. The periodic pulse train is used by the OFDM receiver for estimating, to within a cyclic shift, the periodic convolution of the "pulse" with the initial unshortened overall impulse response. For this reason, it is desirable to be able to detect at least one length-M portion of the received signal that has no interference from the signal that preceded the periodic pulse train. The span of such interference is the length of the initial unshortened overall impulse response, which is at most M. Moreover, as will be explained below, the receiver includes a pulse train detector that works by detecting periodicity and hence detects a length-2M portion of the received signal.

The spectrum of the basic pulse 208 should be non-zero over the entire frequency band used for transmission, so that the channel response can be measured at all frequencies. The pulse 208 is being defined in discrete-time, and hence it is preferable to choose the pulse such that the DFT of the pulse is non-zero for all frequency bins. For this reason, in a preferred embodiment, a linearly-frequency-modulated (LFM) pulse of length M and nominal bandwidth $2\pi$ radians is used as the basic pulse 208 such that the basic pulse is defined as follows $$exp(-j\pi n^2/M),$$

where n is the discrete-time index ranging from 0 to (M−1).

Such an LFM pulse has constant magnitude in discrete-time domain and also has constant magnitude in the frequency domain, and thus its spectrum is non-zero for all frequency bins.

The data signal 204 consists of a sequence of OFDM symbols 205 as shown in FIG. 4. The first OFDM symbol 205 may contain information as to the number of OFDM symbols to follow. When using adaptive coding/modulation, the first OFDM symbol may contain the information as to the particular choice of coding/modulation employed on the subsequent OFDM symbols. In this case, the first OFDM symbol must employ a default coding/modulation scheme that is known by the OFDM receiver.

Figure 5:
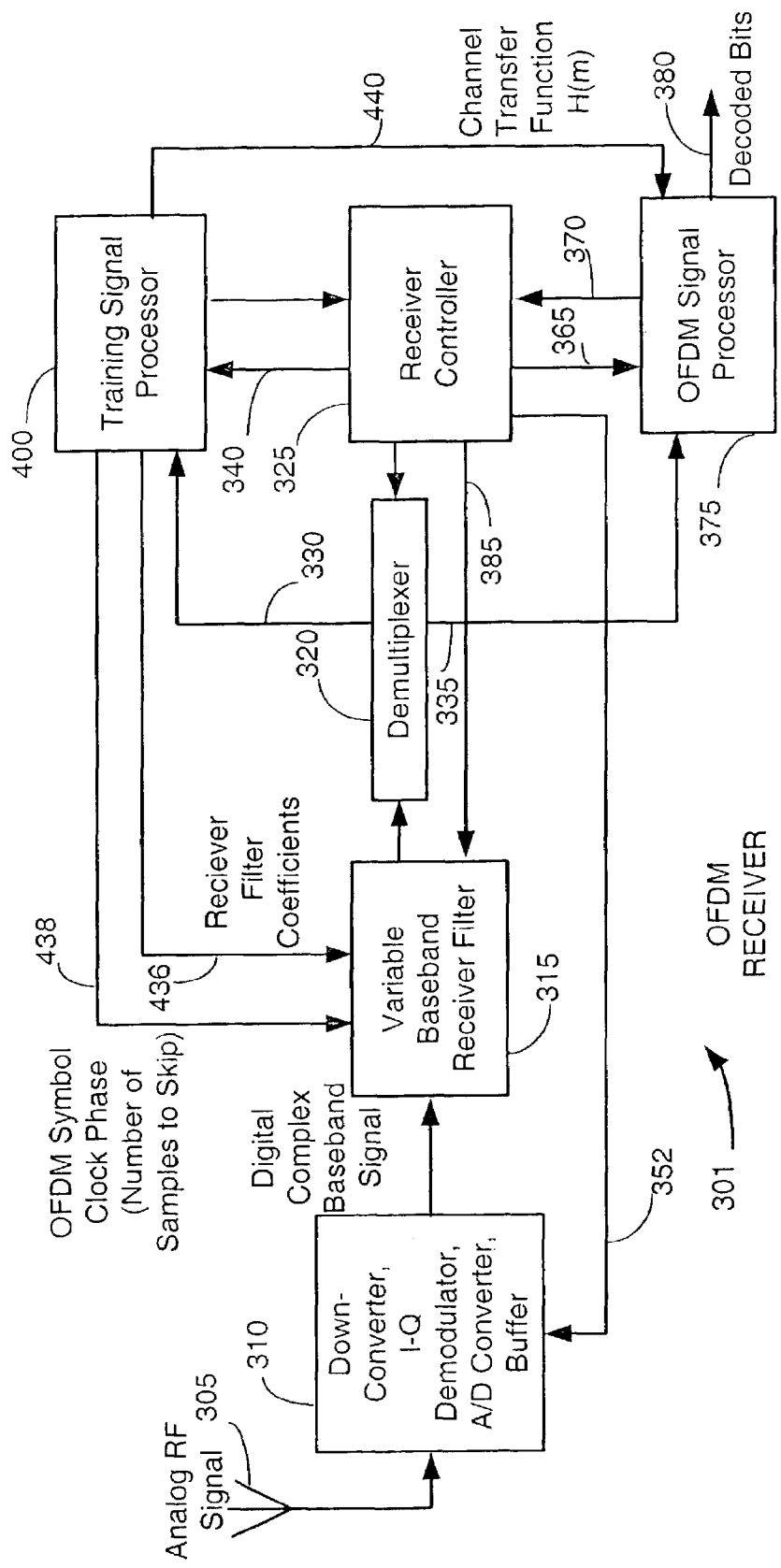
FIG. 5 is a conceptual block diagram of an OFDM receiver according to embodiments of the present invention.

An OFDM receiver 301 according to preferred embodiments of the present invention is shown in FIG. 5. The receiver 301 operates under the control of a receiver controller 325. An analog RF Signal received via a receiver antenna 305 is fed into a receiver module 310 that performs down-conversion, I-Q demodulation, and analog-to-digital conversion. The functions of receiver module 310 can be performed using methods well known in the art. The receiver module outputs a received digital complex baseband signal that is filtered by a variable baseband receiver filter 315, and the filtered received digital complex baseband signal is fed into a demultiplexer 320. The received digital complex baseband signal 36 is the linear convolution of the transmitted baseband signal and the overall impulse response, and hence, it will generally have a wave-form similar to that of transmitted baseband signal 35 but with some smearing across the boundaries.

Under the control of the receiver controller 325 the demultiplexer 320 selectively provides the received digital complex baseband signal to either a first output line 330 or a second output line 335. When first the output line 330 is selected, the filtered received digital complex baseband signal is provided to a training signal processor 400. When the second output 335 is selected, the filtered received digital complex baseband signal is provided to an OFDM Signal Processor 375.

The receiver module 310 can perform down-conversion and analog-to digital conversion using the values of the carrier-frequency and the clock-frequency acquired or estimated using methods that are well known in the art. For example, this can be achieved by sending an auxiliary training consisting of multiple tones, prior to sending the pulse train. The received complex baseband version of the auxiliary training signal will also consist of multiple tones. The frequencies of the received tones, estimated based on the assumption that the carrier-frequency error and the sampling-clock-frequency error are zero, can be combined linearly to produce estimates of the actual carrier-frequency and the sampling-clock-frequency errors. The receiver then adjusts the corresponding oscillators so that the ensuing received digital complex baseband signal will be free of carrier-frequency and sampling-clock-frequency errors. (The frequencies of the tones must be chosen so that the multiple tones portion does not have M-sample-periodicity. Otherwise the pulse train detector 404 can mistake the multiple tones portion for the pulse train portion.)

The variable baseband receiver filter 315 is configured to initially perform baseband filtering on the basis of a default filter transfer function C(m). The default filter transfer function C(m) should cover the entire bandwidth of the transmitted digital complex baseband signal 35. The receiver controller 325 is configured to, as an initial default, cause the demultiplexer 320 to provide the filtered received digital complex baseband signal to the training signal processor 400.

As will be explained in greater detail below, the training signal processor 400 is configured to detect and process the periodic pulse train portion of the received digital complex baseband signal to calculate.
(i) new receiver filter coefficients that would shorten the overall channel impulse response to a desired length of L samples,
(ii) the OFDM symbol clock phase, which is actually the number of samples that must be skipped in order to be aligned with the first OFDM symbol of the data signal portion of the received signal, and
(iii) a new overall impulse response.

In a preferred embodiment, the training signal processor 400 is configured to signal the receiver controller 325 once the training signal has collected enough samples to calculate items (i), (ii) and (iii). The training signal processor 400 is also configured to provide any new receiver filter coefficients that it calculates to the variable baseband receiver filter 315 and inform the receiver controller 325 when it has sent the new coefficients. The receiver controller 325, upon receiving notification that the training signal processor 400 has collected enough samples to calculate the above items (referred to below as "training pulse detection") instructs the variable baseband filter to start storing input samples in a buffer and cease sending the samples to the demultiplexer 320. The receiver controller 325 is configured to, upon receiving subsequent notification from the training signal processor 400 that new filter coefficients have been sent, instruct the variable baseband receiver filter 315 to implement the new receiver filter coefficients received from the training signal processor 400. The training signal processor 400 is also configured to send the OFDM symbol clock phase that it calculates to the variable baseband receiver filter 315 and the receiver controller 325. The OFDM symbol clock phase is actually the number of samples of the received baseband signal 36 that must be skipped in order align with the first OFDM symbol of the data signal portion 204. After the variable baseband receiver filter 315 has skipped the said number of samples (by discarding the appropriate number of samples that have been stored in its buffer), it starts sending output to the demultiplexer 320 again and the receiver controller 325 instructs the demultiplexer 320 to route the received baseband signal 36 to the second output 335 such that the data signal portion 205 is provided to the OFDM signal processor 375.

In a preferred embodiment, the training signal processor 400 also sends the new overall impulse response that it calculates to the OFDM signal processor 375. Based on the calculated new overall impulse response, the OFDM signal processor 375 demodulates the data signal portion 205 of the received baseband signal to produce decoded bits 380.

Figure 6:
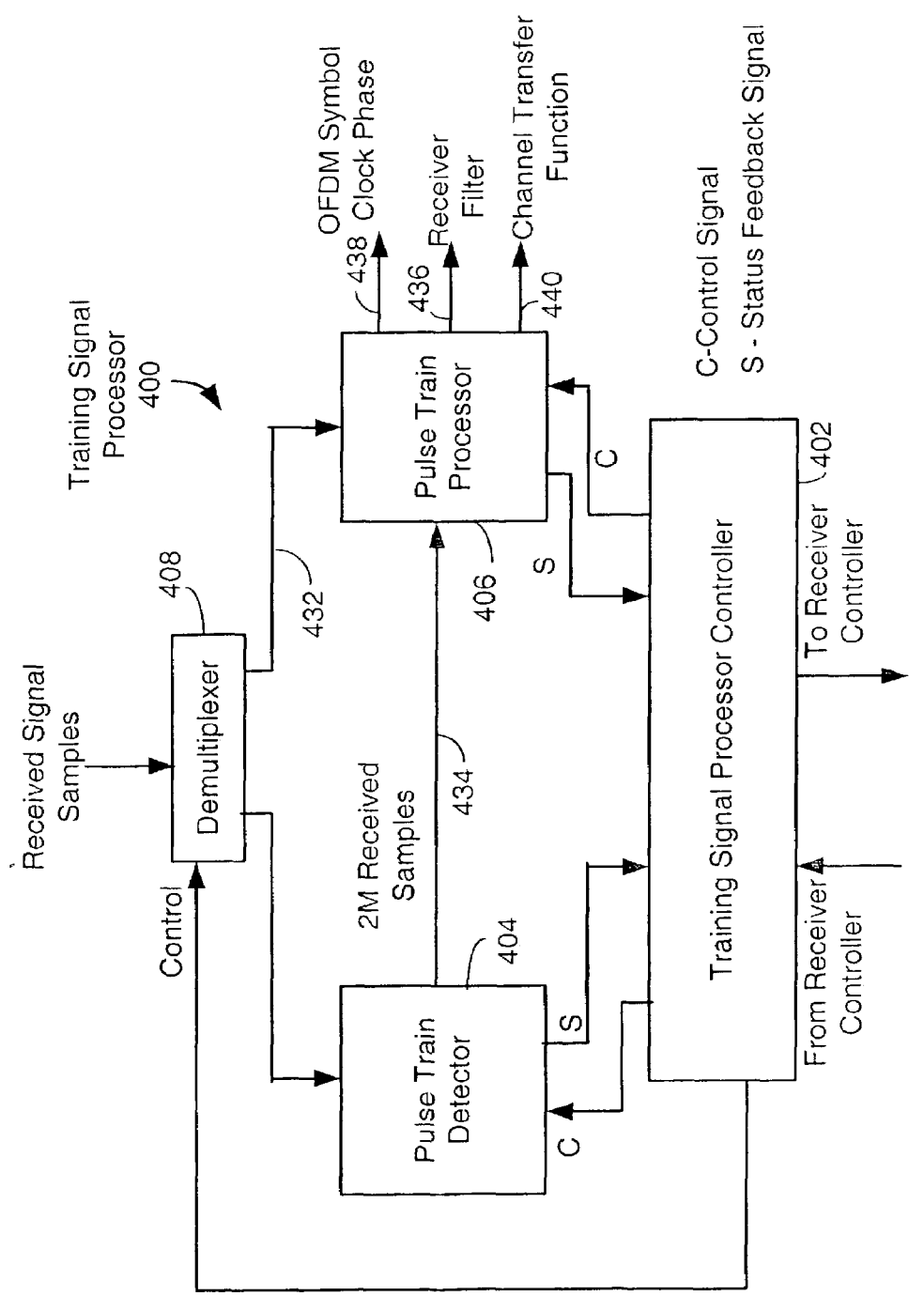
FIG. 6 is a conceptual block diagram of a training signal processor of the receiver of FIG. 5.

An overview of the operation of the OFDM receiver 301 having been provided, the components thereof will now be explained in greater detail. A preferred embodiment of the training signal processor 400 according to the present invention is shown in FIG. 6. The training signal processor 400 operates under the control of a training signal processor controller 402, which in turn receives control signals from, and provides status feedback signals to, the external receiver controller 325.

The training signal processor also includes a pulse train detector 404, a pulse train processor 406, and a demultiplexer 408, which are each configured to receive control signals from, and provide status feedback signals to, the training signal processor controller 402. Under the control of the training signal processor controller 402, the demultiplexer 408 selectively routes "received signal samples" (which are received baseband signals from the receiver demultiplexer 330) to the pulse train detector 404, and subsequently, the pulse train processor 406. When the "received samples" are routed to the pulse train detector 404 it scans the samples for the onset of periodicity of length M. More specifically, the detector 404 scans the signal input to detect a span of 2M samples where the first M samples are the same as the second M samples (to within an error caused by the noise). When such a span of 2M samples has been detected, the pulse train portion 206 of the received baseband signal is deemed detected, and the 2M samples are then passed to pulse train processor 406 from the detector 404, and additionally the pulse train detector 404 sends a status signal to the training signal processor controller 402 advising that training pulse detection has occurred (which in turn advises the receiver controller that training pulse has occurred).

Figure 7:
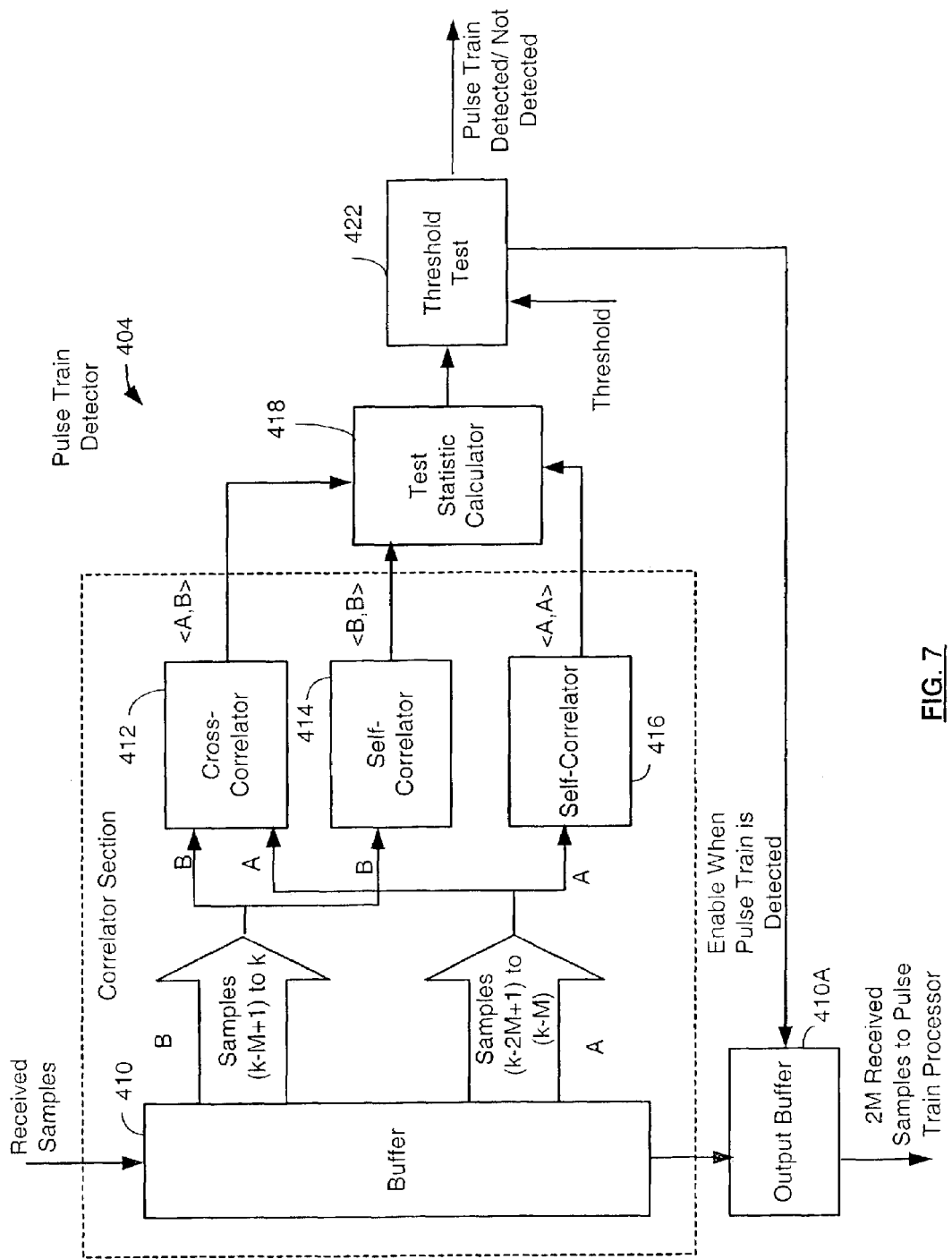
FIG. 7 is a conceptual block diagram of a pulse train detector of the training signal processor of FIG. 6.

A block diagram of the pulse train detector 404, according to embodiments of the present invention, is shown in FIG. 7. The pulse train detector 404 includes a correlator section that includes a buffer 410, a cross-correlator 412 and a pair of self-correlators 414,416. The pulse train detector 404 also includes a test statistic calculator 418 and a threshold test unit 422.

The buffer 410, which may be a shift register, is configured to hold the most recent 2M "received samples". If the "received sample" at discrete time k is denoted by s(k), then the contents of the buffer at time k will be, in the order of increasing time, (s(k−2M+1), s(k−2M+2), ..., s(k−1), s(k)) (Thus, s(k) is the most recent sample, and s(k−2M+1) is the oldest sample). For the purposes of the present explanation, denote by A(k) the column vector $((s(k-2M+1), s(k-2M+2), \ldots, s(k-M-1), s(k-M))^T$, and denote by B(k) the column vector $(s(k-M+1), s(k-M+2), \ldots, s(k-1), s(k))^T$.

As the transmitted training signal is periodic, the corresponding received training signal will also be periodic, except for the initial portion thereof that is of the same length as the overall impulse response of the transmission channel. The pulse train detector 404 works by detecting the onset of this periodicity. More specifically, in the absence of noise, the pulse train detector 404 scans the "received samples" and finds the smallest k for which the condition A(k)=B(k) holds. In the presence of noise, the pulse train detector forms a real-valued Test Statistic whose value is always less than or equal to unity and becomes unity when A(k)=B(k), and then compares this calculated Test Statistic to a threshold that is slightly less than unity. (Note that the maximum of unity is the result of the specific scale factor used. Changing the scale factor will result in a different maximum, but the Test Statistic will fundamentally be the same). The Test Statistic is formed in terms of the self-correlations <A(k),A(k)> and <B(k),B(k)> of A(k) and B(k), respectively, (as determined by self-correlators 414 and 416, respectively) and the cross-correlation <A(k),B(k)> between A(k) and B(k) (as determined by cross-correlator 412).

Having understood that the vectors A(k), B(k) and the Test Statistic are all functions of time k, the index k will be dropped for the remainder of the explanation below. The test statistic calculator 418 uses the correlations <A,A>, <B,B>, and <A,B> to calculate the Test Statistic as a function of time. Examples of two possible embodiments of the test statistic calculator 418, namely a "maximum-likelihood test statistic" calculator and a "correlation test statistic" calculator are illustrated in FIGS. 8A and 8B respectively.

Figure 8A:
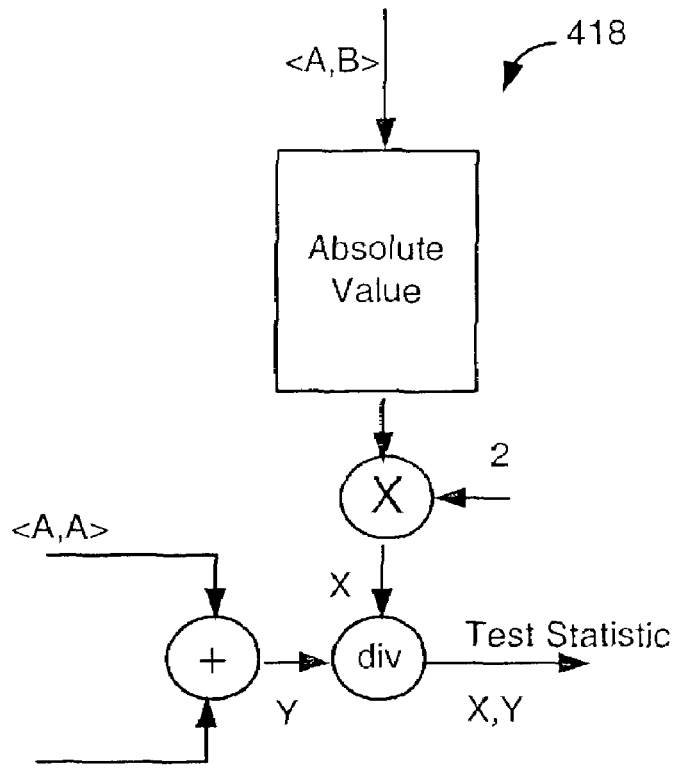
FIGS. 8A and 8B illustrate two examples of a test statistic calculator of the pulse train detector of FIG. 7.
Figure 8B:
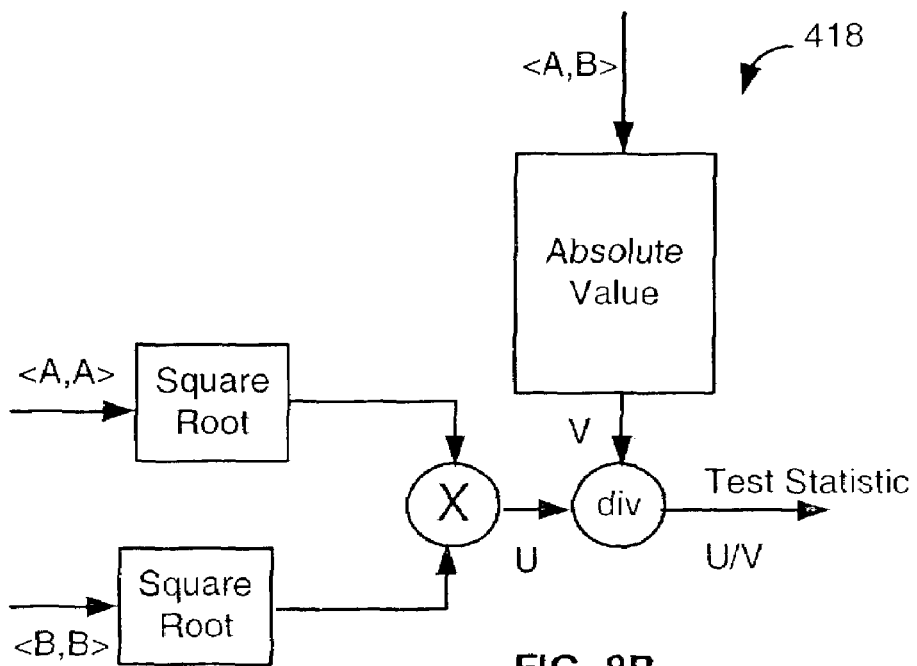

With reference to FIG. 8A, the maximum-likelihood test statistic calculator implements the algorithm.

Test Statistic=2 $Abs(<A,B>)/(<A,A>+<B,B>)$

Note that the above Test Statistic is less than or equal to unity and takes the value unity if and only if B=A exp(jα) for some real α. Thus, the Test Statistic takes the maximum value of unity when A is a scaled version of B, with the scale being unimodular. Assuming that the carrier-frequency error is within ±π/M radians per sampling interval, its value can be estimated by (arg( <A,B>)/M) radians per sampling interval. (In the absence of carrier-frequency error in the "Received Samples", the algorithm Test Statistic=2 Real(<A,B>)/(<A, A>+<B,B>), can be used which is somewhat simpler to calculate because "Real" is easier to calculate than "Abs". Note that the Test Statistic using the "Real" takes values in the range (−1,+1) and takes the value unity if and only if A=B. It takes the value −1 if and only if A=−B.)

Wiith reference to FIG. 8B, the correlation test statistic calculator is motivated by the Schwarz inequality, and implements the algorithm:

Test Statistic=$Abs(<A,B>)/Sqrt(<A,A><B,B>)$

Note that the above Test Statistic is less than or equal to unity and takes the value unity if and only if A=γB for some γ which can be complex-valued in general. This statement is known as the Schwarz inequality. Thus, the Test Statistic takes the maximum value of unity when A is a scaled version of B. Assuming that the carrier-frequency error is within ±π/M radians per sampling interval, its value can be estimated by (arg(<A,B>)/M) radians per sampling interval. (In the absence of carrier-frequency error in the "Received Samples", the form Test Statistic=Real(<A,B>)/Sqrt(<A, A><B,B>) can be used, which is somewhat simpler to calculate because "Real" is easier to calculate than "Abs". Note that the Test Statistic using the "Real" takes values in the range (−1,+1) and takes the value unity if and only if A=yB for some positive y. It takes the value −1 if and only if A=yB for some negative y.)

When forming any of the above Test Statistics, division by zero can be avoided by one of the following methods:
(i) If the denominator is close to zero to within a specified tolerance, say 0.0001, then set the Test Statistic to zero; this is based on the observation that when the denominator is zero, the numerator will also be zero, or
(ii) add a small positive constant, say 0.0001, to the denominator before performing the division. This is called regularization.

Trivial modifications can be made to the Maximum-Likelihood Test Statistic by changing the weights of <A,A> and <B,B> used in the denominator from (1,1) to (x, 2−x) for some positive x between 0 and 2. Similarly, trivial modifications can be made to the Correlation Test Statistic by changing the exponents of <A,A> and <B,B> used in the denominator from (0.5,0.5) to (y, 1−y) for some positive y between 0 and 1.

In one embodiment of the invention, the pulse train detector 404 includes a residual carrier frequency error estimator (not shown) for determining if, based on the output of the cross-correlator 412 and threshold tester 422, any residual carrier frequency error remains, and generating an alarm if such error exceeds a predetermined value.

The operation of threshold test unit 422 will now be considered. In choosing threshold to be applied by the test unit 422, it is desirable to permit detection of the onset of periodicity as early as possible, while avoiding a false detection. The lower the threshold, the earlier the periodicity will be detected when there is actually one. At the same time, when there is no periodicity, the lower the threshold the higher the probability of a false detection.

When the threshold test unit 422 detects that a pulse train has been detected, it sends a detection confirmed status signal to the training signal processor controller 402, and also enables an output portion 410A of the buffer 410 to output the last 2M samples that it received to the pulse train processor 406. If calculation of the maximum likelihood Test Statistic commences well before the training signal has started to arrive at the receiver 301, the Test Statistic will be close to zero. Then as the training signal starts arriving at the receiver, the Test Statistic will increase, with high probability towards unity. As the received signal tends to be periodic, then Test Statistic will remain below unity but close to unity and will exhibit small fluctuations. Thus the pulse train 206 can be deemed detected when the Test Statistic first exceeds a threshold that is slightly below unity, say 0.9999. In a preferred embodiment, the test unit 422 is configured to determine that the pulse train 206 is deemed detected when the Test Statistic first consecutively exceeds a threshold a predetermined number of times.

Figure 9:
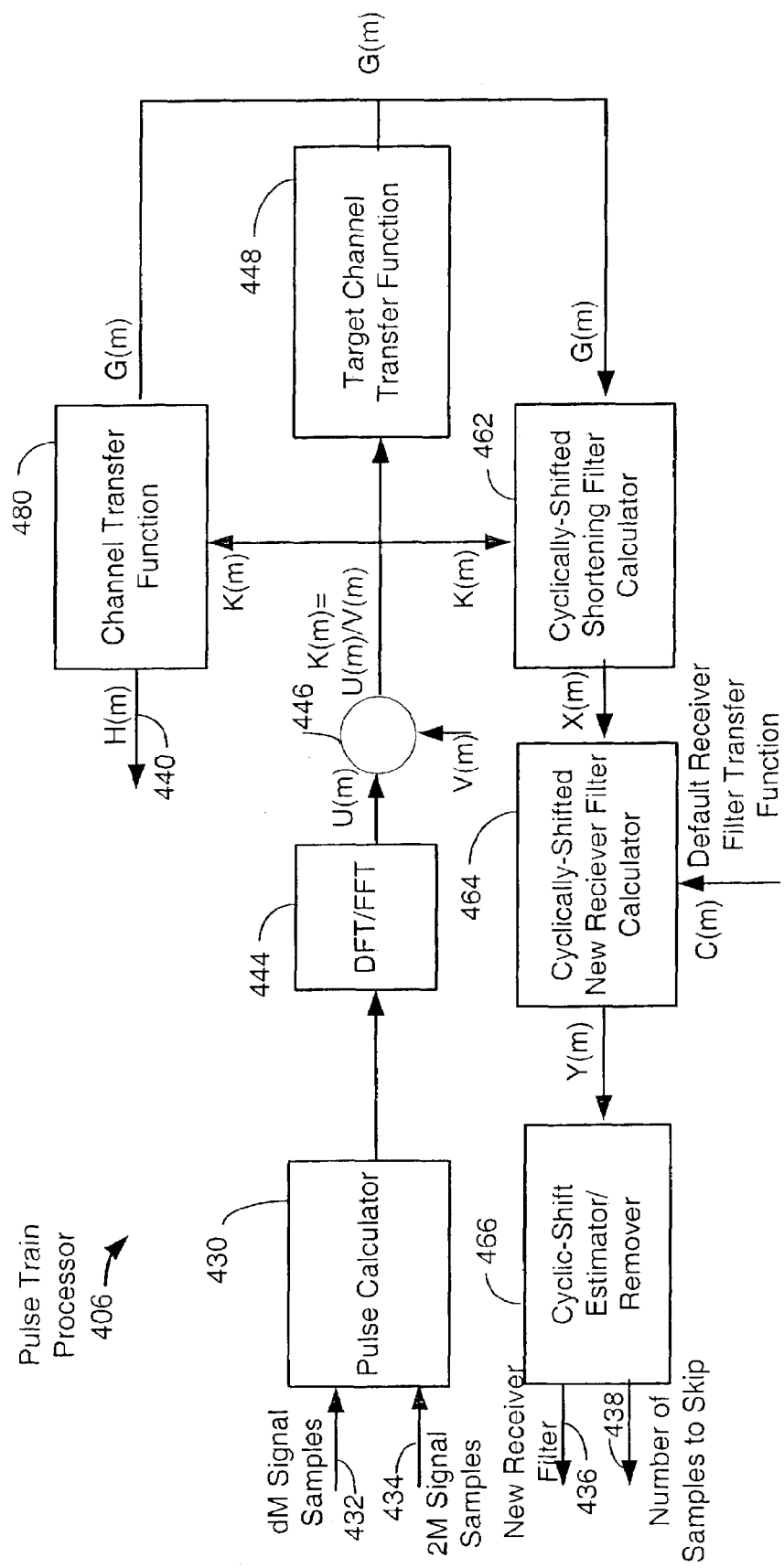
FIG. 9 is a conceptual block diagram of a pulse train processor of the training signal processor of FIG. 6.

FIG. 9 shows a block diagram of a pulse train processor 406 in accordance with embodiments of the present invention. The pulse train processor 406 includes a pulse calculator 430 for calculating an "averaged received pulse" by averaging the first and the second set of M samples as received over a data path 434 from the pulse train detector 404. If the length of the training signal 202 allows it, the pulse calculator 430 may use an additional dM "received signal samples" in calculating the "averaged received pulse", to improve accuracy. Thus, a data path 432 from the demultiplexer 408 to the pulse train processor 406 is provided in a preferred embodiment of the invention to facilitate the use of such additional samples by the pulse train processor 406, with the controller 402 causing the demultiplexer 408 to provide the additional dM samples directly to the pulse train processor 406 once the controller 402 has been notified by the pulse train detector 404 that the pulse train has been detected.

Figure 10:
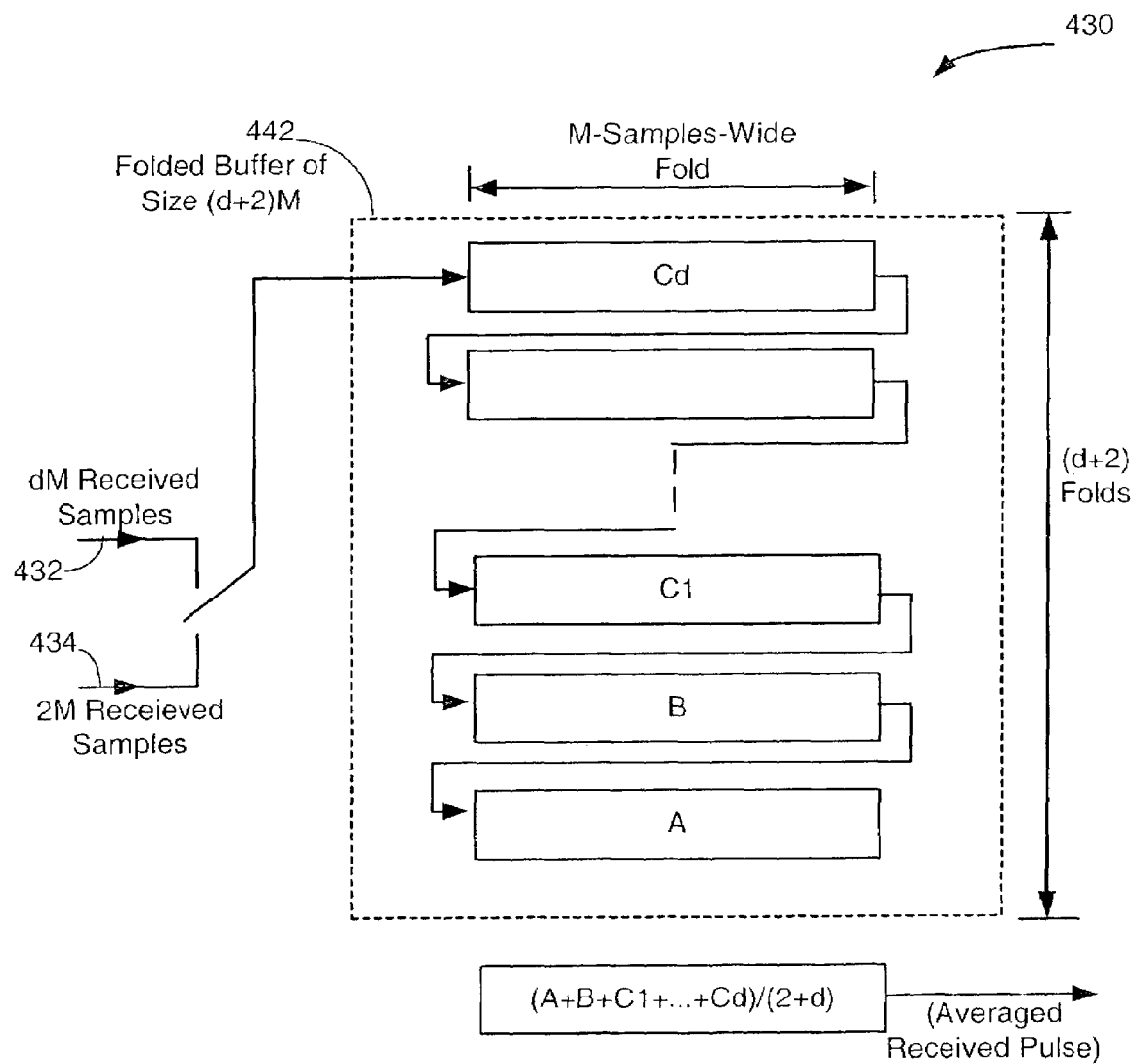
FIG. 10 is a conceptual block diagram of an average received pulse calculator of the pulse train processor of FIG. 9.

FIG. 10 illustrates schematically a pulse calculator 430 in accordance with a preferred embodiment of the invention. The 2M "Received Samples" from the pulse train detector 404 and, optionally, the dM "Received Samples" from the demultiplexer 408, are stored in a buffer 442 of size (2+d)M in the order of time. The buffer 442 can be visualized to have (d+2) folds each of size M. The average over the folds is the "Averaged Received Pulse".

In the absence of noise, and assuming that the pulse detector 404 does not prematurely declare detection, the "Averaged Received Pulse" will be a cyclically shifted version of the cyclic convolution (also known as the periodic convolution) of the "Transmitted Pulse" and the overall channel impulse response. Assuming that the minimum delay of the overall channel impulse response is zero, the amount of negative cyclic shift is equal to the difference between the time of detection and the time of beginning of transmission. In the presence of noise, the "Received Pulse" will be a cyclically shifted version of the cyclic convolution plus some noise. Thus, the "Averaged Received Pulse" output from the pulse calculator 430 is an estimation of the cyclic convolution of a training pulse and the overall channel impulse response.

The pulse train processor 406 includes a DFT 444 to compute the discrete Fourier transform of the "Averaged Received Pulse". The pulse train processor includes a divider 446 for removing the effect of the transmitted pulse from the cyclic convolution. In particular, denoting the DFT 444 output as U(m), where m denotes the sample index that varies from 0 to (M−1), and denoting the DFT of a "Transmitted Pulse" as V(m), the divider 446 divides U(m) by V(m) to effectively cancel out the effect of the transmitted pulse and obtain the DFT, denoted as K(m), of a cyclically shifted version of the overall initial channel impulse response. Recall that the "Transmitted Pulse" was chosen such that V(m) is non-zero for all m, and hence division by zero is avoided. The DFT of the "Averaged Received Pulse" may be computed by using the Fast Fourier Transform Algorithm (FFT). The DFT of the "Transmitted Pulse" (V(m)) may be pre-computed by the FFT algorithm and stored in the training signal processor 400. From K(m), the pulse train processor 406 computes the following three quantities, as described in greater detail below:

(i) A target overall impulse response having a maximum length of L samples, where L is the length of the cyclically-extended guard interval of the OFDM symbols in the subsequent data signal.

(ii) Coefficients for a new receiver filter that achieves a target overall impulse response.

(iii) The number of samples to skip such that, after the new receiver filter coefficients have been implemented by the variable baseband receiver filter 436 and the above mentioned number of samples have been skipped, the receiver 301 will have achieved OFDM symbol synchronization.

With reference to FIG. 9, the pulse train processor includes a target channel transfer function calculator 448 that receives the output K(m) of divider 446 and calculates a target channel transfer function G(m) based on K(m). Both K(m) and G(m) are size-M complex valued vectors whose elements are indexed by m ranging from 0 to (M−1). The M-point IDFT of G(m) is the target channel impulse response. The calculation of G(m) is done under the constraint that the target channel impulse response has a length of at most L samples. Mathematically, the last (M−L) samples of the M-point IDFT of G(m) are zero. Additional constraints may be imposed on G(m), such as a normalized absolute value for a particular m.

Preferably, the target channel transfer function calculator 448 produces an output G(m) that does not vary with the time-domain cyclic shifts of the input K(m). To explain this mathematically, recall that if K(m) is cyclically shifted in time domain by m0 units in the positive direction, then its M-point DFT becomes K(m) exp(−j2pi m0/M). Now, regardless of the value of m0, if K(m)exp(−j 2 pi m0/M) is fed into the target channel transfer function calculator, the output should be G(m), that is the same as if m0=0.

Figure 11:
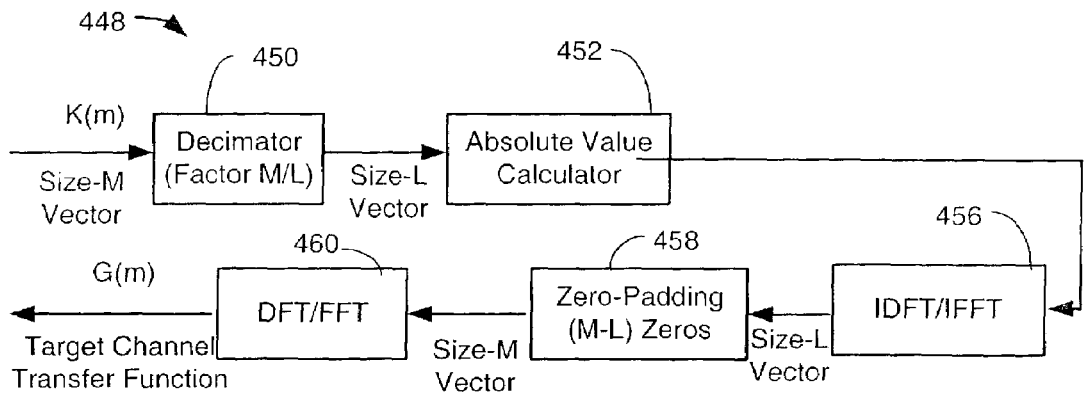
FIG. 11 is a conceptual block diagram of a target channel transfer function calculator of pulse train processor of FIG. 9.

Although a number of different configurations could be used to output such an output G(m), FIG. 11 shows one preferred embodiment of the target channel transfer function calculator 448. The size-M vector K(m) is first fed into a decimator 450 which passes through every (K/L)th element starting from the $0^{th}$ element and discards the rest. In all, L elements are passed through. The size-L vector thus formed is fed into an absolute value calculator 452 that outputs a size-L vector of the absolute values of the L elements.

The resulting size-L vector is fed into a size-L inverse discrete Fourier transformer (IDFT) 456 to produce another size-L vector. As the IDFT will typically be implemented using an inverse fast Fourier transform algorithm, for reasons of computational efficiency, L is preferably chosen as a power of 2 or a product of powers of small integers such as 2 and 3. However, if L itself is small, this criterion need not be used.

The size-L vector at the output of IDFT 456 is extended to a size-M vector by padding (M−L) zeros (at padder 458) and then fed into a size-M discrete Fourier transformer (DFT) 460. The DFT will typically be implemented using a fast Fourier transform algorithm, and hence for reasons of computational efficiency, M should be chosen as a power of 2 or a product of powers of small integers such as 2 and 3.

The size-M vector at the output of the DFT 460 may then be normalized to have some predetermined absolute value for a particular value of m. The normalized output is the target channel transfer function G(m). By virtue of the absolute value calculator 452, the target channel transfer function calculator 448 produces an output G(m) that does not vary with the time-domain cyclic shifts of the input K(m). The net effect of the target channel transfer function calculator 448 is to produce a transfer function having a time limited function (reduction from duration of M discrete time units to L discrete time units, with 0 padding in the extra M-L samples—recall that L is the desired channel impulse response length), that has the substantially the same frequency spectrum as the initial channel impulse response.

Turning again to FIG. 9, the pulse train processor 406 includes a cyclically-shifted shortening filter calculator 462 to which the target channel transfer function G(m) is provided. Recall that K(m) is a cyclically shifted version of the overall un-shortened impulse response. If it was desired to use an additional filter at the receiver so as to achieve the shortened overall impulse response G(m) and if K(m) was truly the overall un-shortened impulse response, then G(m)/K(m) would be the required additional receiver filter. But since K(m) has an unknown amount of cyclic shift, G(m)/K(m) would be a cyclically shifted version of the required additional filter. Since K(m) could be zero for some values of m, the regularized form stated below can be used:

$$X(m)=conj(K(m))G(m)/(abs(K(m))^2+\sigma),$$

where σ is a small positive constant, which can be chosen, for example, as a small factor, say 0.001, of the maximum absolute value of K(m); and X(m) is the transfer function of a cyclically shifted shortening filter. The cyclically-shifted shortening filter calculator 462 calculates X(m) according to the above equation.

In the present invention the variable receiver filter 315 is adjusted in order to achieve the shortened overall impulse response G(m). In effect, the existing or default receiver filter is replaced with a new receiver filter. If X(m) defines the required additional filtering, then $$Y(m)=X(m)C(m),$$

would be the transfer function of the new receiver filter, where C(m) is the transfer function of the default receiver filter. The pulse train processor 406 includes a cyclically-shifted new receiver calculator 464 for calculating Y(m). Since X(m) has an unknown amount of cyclic shift in it, Y(m) as calculated according to the given formula is actually a cyclically shifted version of the new receiver filter transfer function. The pulse train processor 406 includes a cyclic shift estimator and remover 466 to estimate and remove the cyclic shift from Y(m) to produce the new receiver coefficients.

As background for explaining the theory behind the cyclic-shift estimator and remover 466, assume for explanatory purposes the periodic pulse train 206 is very long.

The new receiver filter transfer function is calculated by estimating the amount of cyclic shift present in the cyclically-shifted version Y(m) calculated above and removing it. Suppose there is no cyclic shift to remove. Then filtering the rest of the received digital complex baseband signal with the new receiver filter will yield, after any transients have died down, a periodic train of filtered pulses. The filtered pulse would be the cyclic convolution of the transmitted pulse with the shortened overall impulse response.

Suppose there is a cyclic shift that needs to be removed. Suppose the new receiver filter transfer function is obtained by cyclically shifting y(n) (the IFFT of Y(m)) by m0 units in the positive direction. Filtering the rest of the received digital complex baseband signal with the new receiver filter will yield, after any transients have died down, a periodic train of filtered pulses. The filtered pulse would be the cyclic convolution of the transmitted pulse with the cyclically shifted shortened overall impulse response, with the cyclic shift being m0 units in the positive direction. If the receiver sample clock is advanced by m0 samples in the positive direction, then the received signal will be a periodic train of filtered pulses with the pulse being the cyclic convolution of the transmitted pulse with the shortened overall impulse response.

Figure 12:
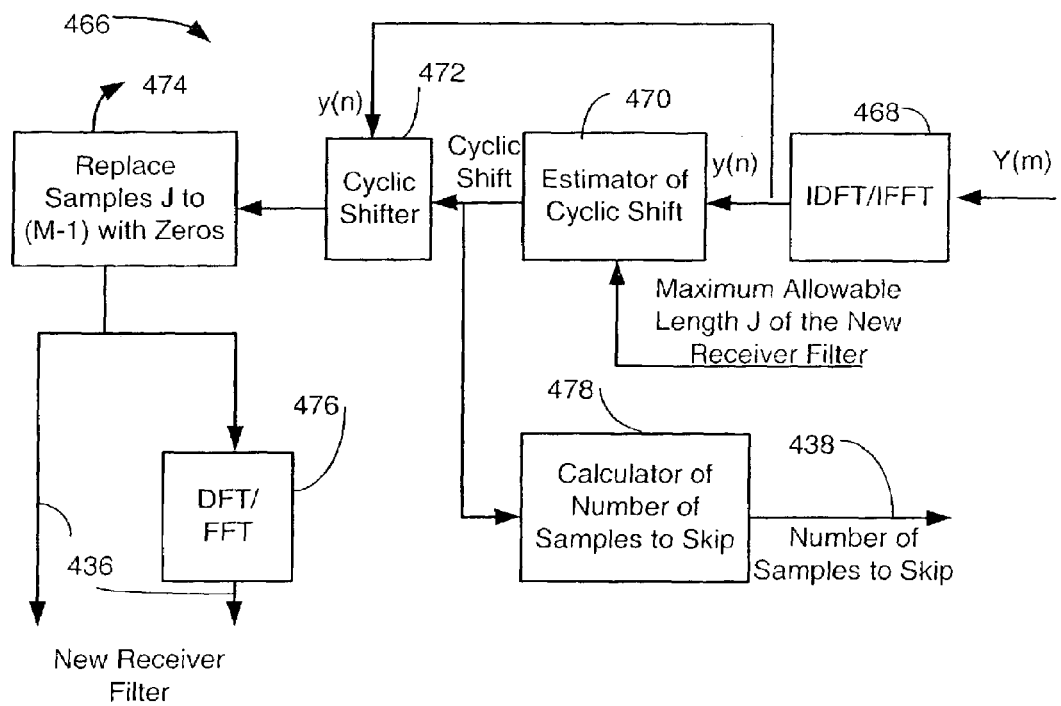
FIG. 12 is a conceptual block diagram of a cyclic-shift estimator/remover of the pulse train processor of FIG. 9.
Figure 13A:
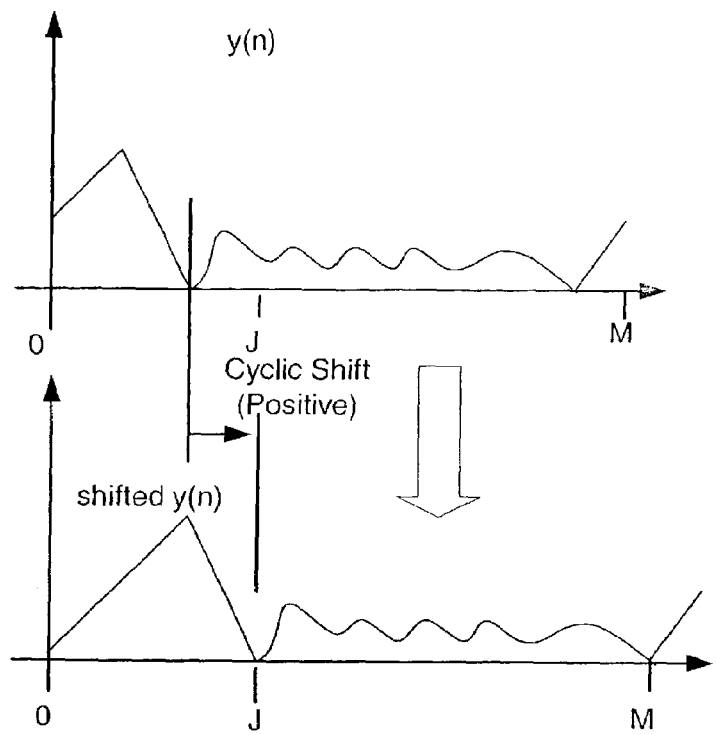
FIGS. 13A and 13B illustrate examples of cyclic shift estimation and removal.
Figure 13B:
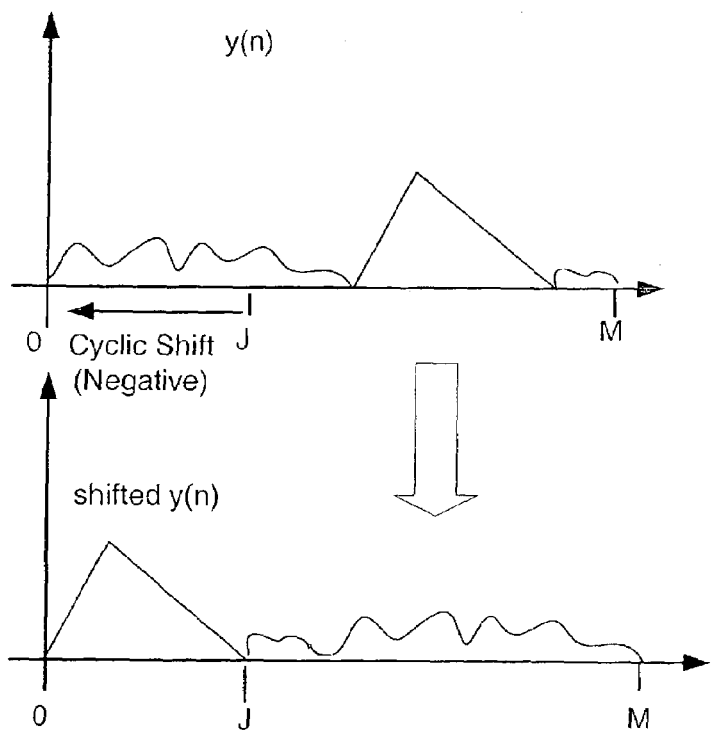

FIG. 12 shows a block diagram of the cyclic shift estimator and remover 466. The M-point DFT, Y(m), from the cyclically shifted new receiver filter calculator 464 is fed into an IDFT to calculate the cyclically shifted impulse response, y(n), of the new receiver filter. The size-M vector y(n) thus formed is fed into a cyclic shift estimator 470 that, conceptually speaking, stores y(n) in a size-M circular buffer. In an ideal environment, the length of the impulse response of the new receiver filter is limited to a maximum of J samples, and there is an interval of length J, along the circular buffer, outside of which y(n) is exactly zero. Under such conditions, it is relatively easy to estimate the cyclic shift and the new receiver filter transfer function. In practice, however, there will be no interval, along the circular buffer, outside of which y(n) is exactly zero. However, heuristically, for a large enough J, there will be an interval, along the circular buffer, outside of which y(n) is "essentially zero". This is illustrated in FIGS. 13A and 13B which illustrate two examples of cyclic shift estimation and removal.

To find such an interval, the cyclic shift estimator 470 uses the total energy of the samples of y(n) in the interval as a criterion to maximize. Here energy of a sample means its squared absolute value, and the total energy of y(n) over an interval means the sum of the energies of the samples in that interval. Other criteria could also be used for finding an interval outside of which y(n) is essentially zero. The result of the above described search is the cyclic shift, which is imparted on y(n) by a cyclic shifter 472 to obtain the new receiver filter impulse response. An optional module 474 may be included to, if the impulse response of the new receiver filter is not exactly zero for sample indices beyond (J−1), set those values to zero. The new filter receiver coefficients can be output as the impulse response of the new receiver filter or a DFT/FFT 476 used to output the transfer function of the new receiver filter on a data line 436. The new receiver filter coefficients are applied to the variable receiver filter 315, causing it to implement the new receiver filter.

The cyclic shift estimator and remover 466 also includes a sample skip calculator 478 that receives the estimated Cyclic Shift from estimator 470 and calculates the number of samples of the received signal that should be skipped to get to the end of the training portion of the received baseband signal. As a first step, skip calculator 478 determines if the estimated Cyclic Shift is positive or negative, and if the Cyclic Shift is negative, sets Cyclic Shift =M−Abs(cclic Shift). The skip calculator then determines the samples to skip using the formula:

(Number of Samples to Skip=Cyclic Shift+Length of Pulse Train−(3+*d*)*M*).

The Number of Samples to Skip is output on data line 438 to the variable baseband receiver filter 315. Note that the Length of Pulse Train is defined as the time difference between the beginning of the data signal 204 and the beginning of the pulse train 206, that is, it includes any intentional gap between the end of the pulse train and the beginning of the data signal.

With reference again to FIG. 9, the pulse train processor 406 includes a channel transfer function calculator 480 for determining the effective channel transfer function H(m) for output on data line 440 to the OFDM signal processor 375. Due to the regularized division of G(m) by K(m) carried out to calculate X(m), the effective overall channel transfer function will differ slightly from G(m). Specifically, the effective overall channel transfer function is determined by calculator 480 as follows:

$$H(m) = abs(K(m))^2 G(m)/(abs(K(m))^2 + \sigma),$$

where σ is the positive constant used in the regularization. H(m) is an M-point transfer function. The N-point transfer function needed by the OFDM signal processor 375 is obtained by sampling-rate conversion.

After the new receiver filter has been implemented by variable filter 315 and the "Number of Samples to Skip" has been skipped from the ensuing output, the output is directed to the OFDM signal processor 375 via the demultiplexer 320. At such time, the OFDM symbol clock of processor 375 is initialized to zero to indicate that the first sample received by the OFDM signal processor is the beginning of an OFDM Symbol. From this point onwards, the OFDM symbol clock operates as a modulo (N+L) counter of the samples received, and the sample received by the OFDM signal processor 375 when the counter reaches zero is taken as the beginning of the next OFDM symbol. Thus the OFDM symbol clock marks the boundaries between successive OFDM Symbols.

Figure 14:
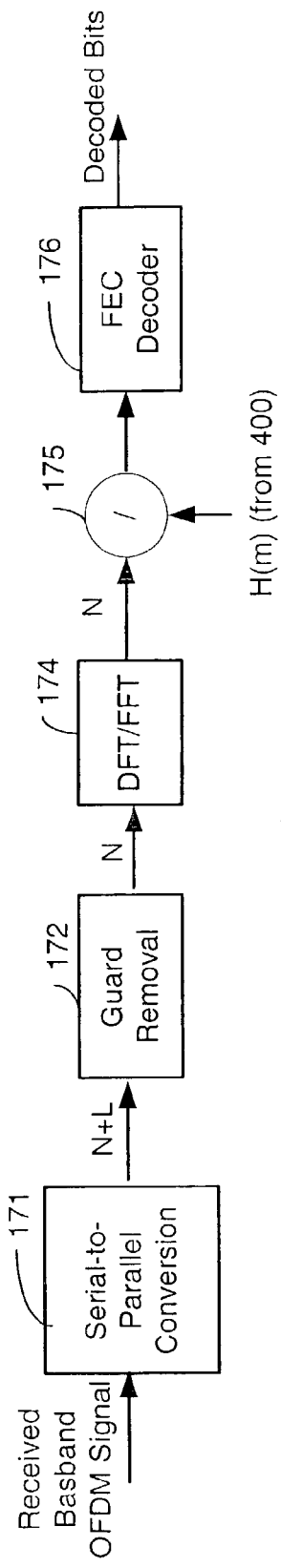
FIG. 14 is a conceptual block diagram of an OFDM signal processor of the receiver of FIG. 5.

Once the receiver 301 has achieved OFDM symbol synchronization as described above, the OFDM Signal Processor 375 processes the received samples as follows to estimate the complex numbers that were transmitted on each sub-carrier. With reference to FIG. 14, every time the OFDM Symbol Clock reaches zero, the OFDM Signal Processor 375 starts collecting (N+L) received samples into a vector, where N is the orthogonality interval and L is the cyclic prefix guard length used at the transmitter; in FIG. 14 this function is performed by the Serial-to-Parallel Conversion module 171. The OFDM Signal Processor 375 includes a guard removal module 172 that discards the first L samples, and a DFT module 174 that takes the Discrete Fourier Transform (DFT) of the subsequent N samples and divides this DFT by the channel transfer function H(m) (the N-point DFT of the new overall impulse response) at a divider 175 to obtain estimates of the complex numbers that were transmitted on each sub-carrier. (In previous OFDM Signal Processors, pilots are typically used to estimate a channel transfer function. In the presently described embodiment, the channel transfer function estimated by the pulse train processor 406 is used.) The OFDM signal processor 375 passes the estimates of the complex numbers to a decoder if forward error correction coding was employed at the transmitter and to a quantizing decision device otherwise. The decoder or the decision device produces the decoded bits.

The above description pertains to receiving a data burst. It is assumed that the receiver is in the "ready" state before the data burst is transmitted. To receive a sequence of data bursts separated by idle times, the receiver must be in the "ready" state before the first data burst is transmitted, and the receiver must, revert to the "ready" state before the second data burst is transmitted, and so on.

It will thus be understood that the present invention relates to improving the efficiency of an OFDM communication system via impulse response shortening and also facilitating fast OFDM symbol synchronization. The shortened impulse response allows the use of a shorter cyclically extended guard portion and thus improves the throughput and efficiency of the system.

Although the embodiments described above have been presented in the context of an OFDM transmission system, the present invention could also be used in other multi-carrier modulation systems and also in certain single carrier systems. For example, the present invention can also be used in block-based single-carrier systems, without substantial changes, for the same purposes as in OFDM systems. Typically, in block-based single-carrier systems, the data blocks have a cyclically extended guard portion and channel equalization is performed in the frequency-domain. The invention can also be used in single carrier communications systems that use Maximum Likelihood Sequence Estimation (Formey-type or Ungerboeck-type) to reduce the complexity of such systems.

Many modifications of the preferred embodiment are possible without exceeding the scope of the present invention, and many of those would be obvious to those skilled in the art. Although the invention has been described in connection with a preferred embodiment, it will be understood that this description is not intended to limit the invention thereto, but the invention is intended to cover all modifications and alternative constructions falling within the spirit and scope of the invention as expressed in the claims.

The invention claimed is:

1. A method for receiving at a receiver having a variable filter a transmitted signal that includes a periodic training signal and a data signal comprising OFDM symbols having cyclic guard intervals, the periodic training signal comprising a succession of substantially identical training pulses, the method comprising:
   (a) receiving and sampling the transmitted signal at the receiver to produce a digital complex baseband signal;
   (b) filtering the digital complex baseband signal with the variable filter;
   (c) detecting the periodic training signal in the filtered digital complex baseband signal, wherein each of the training pulses of the periodic training signal includes a linearly-frequency-modulated (LFM) pulse;
   (d) upon detecting the periodic training signal, computing a number of training signal samples remaining until the data signal commences to synchronize decoding of the data signal;
   (e) determining a desired channel impulse response based on the detected periodic training signal, comprising estimating a periodic convolution of an undistorted training pulse with an initial channel impulse response for use in determining the desired channel impulse response;
   (f) calculating filter coefficients required by the variable filter to achieve the desired channel impulse response; and
   (g) adjusting the variable filter according to the calculated filter coefficients.

2. The method of claim 1 wherein step (c) includes:
   detecting the periodic training signal by determining when a threshold level of symmetry exists between a first set of samples and a second set of samples of the filtered digital complex baseband signal, each of the first and second sample sets being associated with a respective training pulse period.

3. A method for receiving at a receiver having a variable filter a transmitted signal that includes a periodic training signal and a data signal comprising OFDM symbols having cyclic guard intervals, the periodic training signal comprising a succession of substantially identical training pulses, the method comprising:
   (a) receiving and sampling the transmitted signal at the receiver to produce a digital complex baseband signal;
   (b) filtering the digital complex baseband signal with the variable filter;
   (c) detecting the periodic training signal in the filtered digital complex baseband signal by determining when a threshold level of symmetry exists between a first set of samples and a second set of samples of the filtered digital complex baseband signal, each of the first and second sample sets being associated with a respective training pulse period, wherein each of the training pulses of the periodic training signal includes a linearly-frequency-modulated (LFM) pulse;
   (d) determining a desired channel impulse response based on the detected periodic training signal, comprising estimating a periodic convolution of an undistorted training pulse with an initial channel impulse response for use in determining the desired channel impulse response, wherein estimating a periodic convolution of an undistorted training pulse with an initial channel impulse response includes averaging at least the first and second sample sets;
   (e) calculating filter coefficients required by the variable filter to achieve the desired channel impulse response; and
   (f) adjusting the variable filter according to the calculated filter coefficients.

4. The method of claim 3 wherein step (d) includes estimating a cyclically-shifted initial channel transfer function by dividing a forward Fourier transform of the estimated periodic convolution by a forward Fourier transform of an undistorted training pulse, and determining a cyclically-shifted target transfer function by shortening the estimated cyclically-shifted initial channel transfer function to a target time duration, the desired channel impulse response being dependent on the cyclically-shifted target transfer function.

5. The method of claim 2 wherein the periodic training signal includes at least three linearly-frequency modulated pulses.

6. The method of claim 5 wherein the linearly-frequency modulated pulses each have a non-zero spectrum for substantially all of a channel bandwidth used for the OFDM symbols.

7. The method of claim 1 including estimating complex numbers transmitted in the OFDM symbols in dependence on the desired channel impulse response.

8. A receiver for a transmitted signal that includes a periodic training signal, comprising:
   a converter for receiving the transmitted signal and producing a digital complex baseband signal representative thereof;
   a variable baseband receiver filter for receiving and filtering the digital complex baseband signal in dependence on filter coefficients; and
   a training signal processor for detecting the periodic training signal portion within the filtered digital complex baseband signal, estimating an initial channel impulse response based on the detected periodic training signal, calculating a shortened target channel impulse response in dependence on the initial channel impulse response and a predetermined target channel impulse response length, determining new filter coefficients required to implement the target channel impulse response, and providing the new filter coefficients to the variable baseband receiver filter for use in filtering a data portion of the digital complex baseband signal following the periodic training signal portion, wherein the training signal processor includes (i) a pulse train detector having correlation means for detecting the periodic training signal when a threshold level of symmetry exists between a first set of samples and a second set of samples of the filtered digital complex baseband signal, each of the sample sets corresponding to a training pulse period; (ii) an averaged pulse calculator for averaging at least the first and second sets of samples to output an estimate of a cyclically shifted convolution of an transmitted training signal pulse with an initial channel impulse response; and (iii) means for estimating a cyclically-shifted initial channel transfer function by dividing a forward Fourier transform of an estimated periodic convolution of an undistorted training pulse by a forward Fourier transform of an undistorted training pulse, and determining a cyclically-shifted target transfer function by shortening the estimated cyclically-shifted initial channel transfer function to a target time duration, the target channel impulse response being dependent on the cyclically-shifted target transfer function.

9. The receiver of claim 8 wherein the data portion of the transmitted signal includes OFDM symbols each having a cyclic guard interval, the predetermined target channel impulse length being equal to or less than the cyclic guard interval, and the receiver includes an OFDM signal processor for decoding the OFDM symbols to produce a digital receiver output signal.

10. The receiver of claim 9 wherein the OFDM signal processor decodes the OFDM symbols in dependence on the target channel impulse response.

11. The receiver of claim 9 wherein the training signal includes a succession of substantially identical training pulses.

12. The receiver of claim 9 wherein the training signal processor includes means for calculating, once the training signal has been detected, a number of samples remaining until the data portion commences, and routing means for routing the data portion to the OFDM signal processor upon commencement of the data portion.

13. The receiver of claim 11 wherein the training pulses are linearly frequency modulated pulses with a non-zero spectrum for substantially all of a channel bandwidth used for the OFDM symbols.

14. A method for receiving at a receiver having a variable filter a transmitted signal that includes a periodic training signal and a data signal comprising OFDM symbols having cyclic guard intervals, the periodic training signal comprising a succession of substantially identical training pulses, the method comprising:
(a) receiving and sampling the transmitted signal at the receiver to produce a digital complex baseband signal;
(b) filtering the digital complex baseband signal with the variable filter;
(c) detecting the periodic training signal in the filtered digital complex baseband signal, including detecting the periodic training signal by determining when a threshold level of symmetry exists between a first set of samples and a second set of samples of the filtered digital complex baseband signal, each of the first and second sample sets being associated with a respective training pulse period;
(d) determining a desired channel impulse response based on the detected periodic training signal, comprising estimating a periodic convolution of an undistorted training pulse with an initial channel impulse response for use in determining the desired channel impulse response, wherein estimating the periodic convolution of an undistorted training pulse with an initial channel impulse response includes averaging at least the first and second sample sets;
(e) calculating filter coefficients required by the variable filter to achieve the desired channel impulse response; and
(f) adjusting the variable filter according to the calculated filter coefficients.

15. A method for receiving at a receiver having a variable filter a transmitted signal that includes a periodic training signal and a data signal comprising OFDM symbols having cyclic guard intervals, the periodic training signal comprising a succession of substantially identical training pulses, and the data signal follows the training signal, the method comprising:
(a) receiving and sampling the transmitted signal at the receiver to produce a digital complex baseband signal;
(b) filtering the digital complex baseband signal with the variable filter;
(c) detecting the periodic training signal in the filtered digital complex baseband signal and upon detecting the periodic training signal, computing a number of training signal samples remaining until the data signal commences to synchronize decoding of the data signal;
(d) determining a desired channel impulse response based on the detected periodic training signal, comprising estimating a periodic convolution of an undistorted training pulse with an initial channel impulse response for use in determining the desired channel impulse response;
(e) calculating filter coefficients required by the variable filter to achieve the desired channel impulse response; and
(f) adjusting the variable filter according to the calculated filter coefficients.

* * * * *